United States Patent
Ide

(10) Patent No.: US 9,252,091 B2
(45) Date of Patent: Feb. 2, 2016

(54) SEMICONDUCTOR DEVICE HAVING PENETRATING ELECTRODES EACH PENETRATING THROUGH SEMICONDUCTOR CHIP

(71) Applicant: PS4 Luxco S.a.r.l., Luxembourg (LU)

(72) Inventor: Akira Ide, Tokyo (JP)

(73) Assignee: PS4 Luxco S.a.r.l., Luxembourg (LU)

( * ) Notice: Subject to any disclaimer, the term of this patent is extended or adjusted under 35 U.S.C. 154(b) by 0 days.

(21) Appl. No.: 13/827,514

(22) Filed: Mar. 14, 2013

(65) Prior Publication Data

US 2013/0249085 A1 Sep. 26, 2013

(30) Foreign Application Priority Data

Mar. 21, 2012 (JP) ................................. 2012-064108

(51) Int. Cl.
*H01L 23/498* (2006.01)
*H01L 23/48* (2006.01)
*H01L 23/544* (2006.01)
*H01L 25/065* (2006.01)
*H01L 23/31* (2006.01)

(52) U.S. Cl.
CPC ...... *H01L 23/49811* (2013.01); *H01L 23/3135* (2013.01); *H01L 23/481* (2013.01); *H01L 23/544* (2013.01); *H01L 25/0657* (2013.01); H01L 23/3128 (2013.01); H01L 23/49816 (2013.01); H01L 2223/5442 (2013.01); H01L 2223/54426 (2013.01); H01L 2223/54473 (2013.01); H01L 2224/02372 (2013.01); H01L 2224/13025 (2013.01); H01L 2224/16145 (2013.01); H01L 2224/16146 (2013.01); H01L 2225/0652 (2013.01); H01L 2225/06513 (2013.01); H01L 2225/06517 (2013.01); H01L 2225/06541 (2013.01); H01L 2225/06544 (2013.01); H01L 2225/06548 (2013.01); H01L 2225/06551 (2013.01); H01L 2225/06565 (2013.01)

(58) Field of Classification Search
CPC .............. H01L 23/49827; H01L 2224/02372; H01L 2224/13025; H01L 2224/16146; H01L 2225/0652; H01L 2225/06541; H01L 2225/06548; H01L 2225/06551
See application file for complete search history.

(56) References Cited

U.S. PATENT DOCUMENTS

| | | | | |
|---|---|---|---|---|
| 5,637,920 | A * | 6/1997 | Loo | 257/700 |
| 6,448,661 | B1 * | 9/2002 | Kim et al. | 257/777 |
| 6,979,897 | B2 * | 12/2005 | Ma | 257/691 |
| 7,098,679 | B2 * | 8/2006 | Dick et al. | 324/754.03 |
| 7,122,912 | B2 | 10/2006 | Matsui | |
| 7,883,985 | B2 | 2/2011 | Matsui | |
| 8,154,134 | B2 * | 4/2012 | Bonifield et al. | 257/774 |
| 8,218,334 | B2 * | 7/2012 | Chow et al. | 361/790 |
| 8,310,033 | B2 * | 11/2012 | Jin et al. | 257/621 |

(Continued)

FOREIGN PATENT DOCUMENTS

JP 2005-217071 A 8/2005

*Primary Examiner* — Ida M Soward

(57) ABSTRACT

Disclosed herein is a device that includes: a semiconductor substrate; plurality of first through-substrate vias each penetrating through the semiconductor substrate, a plurality of second through-substrate vias each penetrating through the semiconductor substrate, an insulating film formed over the semiconductor substrate, the insulating film including a first opening and a plurality of second openings, the first opening being located over the first through-substrate vias, and each of the second openings being located over a corresponding one of the second through-substrate vias.

14 Claims, 14 Drawing Sheets

(56) References Cited

U.S. PATENT DOCUMENTS

| | | | |
|---|---|---|---|
| 8,344,512 B2* | 1/2013 | Knickerbocker | 257/773 |
| 8,558,395 B2* | 10/2013 | Khan et al. | 257/778 |
| 8,599,596 B2* | 12/2013 | Riho | 365/63 |
| 8,765,526 B2* | 7/2014 | Ide | 438/106 |
| 8,928,159 B2* | 1/2015 | Chang et al. | 257/797 |
| 8,941,233 B1* | 1/2015 | Ngai et al. | 257/712 |
| 2002/0008531 A1* | 1/2002 | Hamren | 324/755 |
| 2003/0104687 A1* | 6/2003 | Abreu et al. | 438/613 |
| 2003/0106711 A1* | 6/2003 | Rumsey et al. | 174/261 |
| 2007/0007641 A1* | 1/2007 | Lee et al. | 257/691 |
| 2007/0184604 A1* | 8/2007 | Honda | 438/206 |
| 2008/0265434 A1* | 10/2008 | Kurita | 257/777 |
| 2009/0293271 A1* | 12/2009 | Tanaka | 29/832 |
| 2010/0237386 A1* | 9/2010 | Lin et al. | 257/173 |
| 2011/0101524 A1* | 5/2011 | Camacho et al. | 257/737 |
| 2011/0285005 A1* | 11/2011 | Lin et al. | 257/686 |
| 2012/0038045 A1* | 2/2012 | Lee | 257/738 |
| 2012/0164788 A1* | 6/2012 | Ide | 438/109 |
| 2012/0217653 A1* | 8/2012 | Takemura et al. | 257/774 |
| 2012/0220079 A1* | 8/2012 | Fujii | 438/107 |
| 2012/0292746 A1* | 11/2012 | Lee et al. | 257/621 |
| 2013/0001806 A1* | 1/2013 | Mah | 257/786 |
| 2013/0119528 A1* | 5/2013 | Groothuis et al. | 257/690 |
| 2014/0008798 A1* | 1/2014 | Baba et al. | 257/738 |

\* cited by examiner

SEMICONDUCTOR DEVICE HAVING PENETRATING ELECTRODES EACH PENETRATING THROUGH SEMICONDUCTOR CHIP

This application claims priority to Japanese patent application No. 2012-064108, filed Mar. 21, 2012, the entire contents of which is incorporated herein by reference.

BACKGROUND OF THE INVENTION

1. Field of the Invention

The present invention relates to a semiconductor device, and particularly to a semiconductor device equipped with a penetrating electrode which is so provided as to pass through a semiconductor chip.

2. Description of Related Art

Storage capacity required for semiconductor memory devices such as DRAM (Dynamic Random Access Memory) has been growing year by year. To satisfy the requirement, in recent years, a memory device called multi-chip package has been proposed. In the multi-chip package, a plurality of memory chips are stacked. However, in the case of the multi-chip package, wires that connect each memory chip and a package substrate are necessary. Therefore, it is difficult to stack many memory chips.

On the other hand, in recent years, a semiconductor device of a type in which a plurality of memory chips with penetrating electrodes are stacked has been proposed. In the semiconductor device of the type, among penetrating electrodes provided on each memory chip, the penetrating electrodes that are provided on the same plane position when seen from a stacking direction are electrically short-circuited. Therefore, even if the number of chips stacked increases, the number of electrodes connected to the package substrate does not increase. Thus, it is possible to stack a larger number of memory chips.

When the semiconductor chips with penetrating electrodes are stacked, bump electrodes provided on upper and lower chips need to be in accurate contact with each other. Therefore, the chips are stacked as positioning is performed by referencing alignment marks provided on the upper and lower chips. There is disclosed in Japanese Patent Application Laid-Open No. 2005-217071 is a semiconductor device that uses penetrating electrodes as alignment marks.

However, the alignment marks disclosed in Japanese Patent Application Laid-Open No. 2005-217071 have a different planar shape from original penetrating electrodes that are used for transmitting and receiving of signals, power supply, or the like, such as a cross shape or L-shape. A process of forming the penetrating electrodes is controlled in such a way as to most accurately form original penetrating electrodes. Accordingly, if making of alignment marks of a different shape from the original penetrating electrodes is performed in the same process as that of the original penetrating electrodes as disclosed in Japanese Patent Application Laid-Open No. 2005-217071, the alignment marks might not be accurately formed.

If the accuracy of the alignment marks is low, there are great difficulties in stacking the chips. The alignment marks are recognized by a recognition camera provided on a flip chip bonder. However, the devices that are now available in the market require a dimensional accuracy of 1 µm or less for alignment marks to enable the recognition camera to accurately recognize the positions. On the other hand, the film thickness of photoresist used for formation of penetrating electrodes needs to be about 20 µm. As a result, an edge of the photoresist becomes tapered. If different planar shapes of the penetrating electrodes, such as a cross shape or L-shape, are used, distortion of the shape or the like is likely to occur, making it difficult to realize a dimensional accuracy of 1 µm or less.

SUMMARY

In one embodiment, there is provided a semiconductor device that includes: a semiconductor substrate including a first surface and a second surface opposite to each other; and a plurality of first through-substrate vias each penetrating through the semiconductor substrate from the first surface to the second surface, each of the first through-substrate vias including a first bump that protrudes from the first surface of the semiconductor substrate. The first bumps serve as a first surface alignment mark formed on the first surface of the semiconductor substrate.

In another embodiment, there is provided a semiconductor device that includes: a semiconductor substrate; first and second conductive patterns provided over a surface of the semiconductor substrate; a plurality of first through-substrate vias each penetrating through the semiconductor substrate; a plurality of second through-substrate vias each penetrating through the semiconductor substrate; and a plurality of third through-substrate vias each penetrating through the semiconductor substrate. The first through-substrate vias are arranged in a first pitch in a first corner portion of the semiconductor substrate and are coupled in common to the first conductive pattern. The second through-substrate vias are arranged in the first pitch in a second corner of the semiconductor substrate and are coupled in common to the second conductive pattern. The third through-substrate vias are arranged in a second pitch that is greater than the first pitch and are supplied respectively with signals.

In still another embodiment, there is provided a device that includes: a semiconductor substrate; a plurality of first through-substrate vias each penetrating through the semiconductor substrate, a plurality of second through-substrate vias each penetrating through the semiconductor substrate, an insulating film formed over the semiconductor substrate, the insulating film including a first opening and a plurality of second openings, the first opening being located over the first through-substrate vias, and each of the second openings being located over a corresponding one of the second through-substrate vias.

BRIEF DESCRIPTION OF THE DRAWINGS

FIG. 8A shows a layout of the principal surface, and FIG. 8B shows a layout of the back surface;

FIG. 10A shows a layout of the principal surface, and FIG. 10B shows a layout of the back surface;

FIG. 11A shows a layout of the principal surface.

FIG. 12A shows a layout of the principal surface.

DETAILED DESCRIPTION OF THE EMBODIMENTS

Preferred embodiments of the present invention will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structure, logical and electrical changes may be made without departing from the scope of the present invention. The various embodiments disclosed herein are not necessarily mutually exclusive, as some disclosed embodiments can be combined with one or more other disclosed embodiments to form new embodiments.

Figure 1:
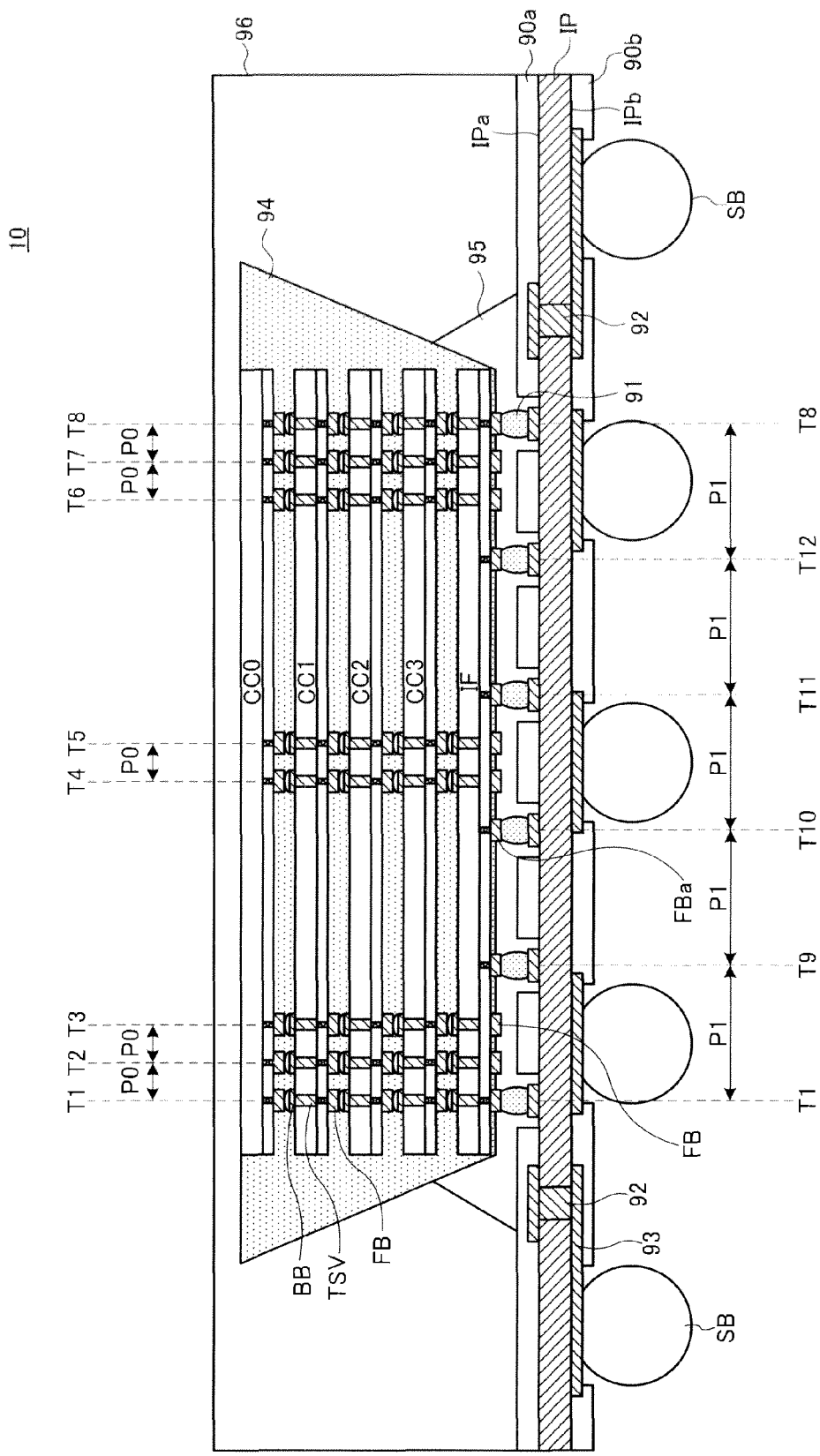
FIG. 1 is a schematic cross-sectional view of a semiconductor device an embodiment of the present invention.

Referring now to FIG. 1, the semiconductor device 10 of the embodiment has a structure in which the following components are stacked: four core chips CC0 to CC3, which have the same functions and are produced with the use of the same production mask; one interface chip IF, which is produced with the use of a different production mask from that of the core chips CC0 to CC3; and one interposer IP. The core chips CC0 to C03 and the interface chip IF are semiconductor chips for which a silicon substrate is used, and are stacked by a face-down manner on the interposer IP. The face-down manner means a method of mounting semiconductor chips in such a way that principal surfaces on which electronic circuits such as transistors are formed face downward, or that the principal surfaces face the interposer IP's side.

However, the semiconductor device of the present invention is not limited to the above structure. The semiconductor chips each may be stacked by a face-up manner. The face-up manner means a method of mounting semiconductor chips in such a way that principal surfaces on which electronic circuits such as transistors are formed face upward, or that the principal surfaces face a side opposite to the interposer IP's side. Alternatively, the semiconductor chips stacked by the face-down manner, and the semiconductor chips stacked by the face-up manner may exist together.

The core chips CC1 to CC3 and the interface chip IF other than the core chip CC0 placed on the top layer are provided with large numbers of penetrating electrodes TSV that pass through a silicon substrate. The penetrating electrodes may be called penetration electrodes, through-electrodes, through-vias, through-silicon vias or through-substrate vias. In areas that overlap with the penetrating electrodes TSV when seen from a stacking direction in planar view, top-surface bumps FB are provided on the principal-surface sides of the chips, and back-surface bumps BB are provided on the back-surface sides of the chips. The back-surface bumps BB of a semiconductor chip placed on a lower layer are bonded to the top-surface bumps FB of a semiconductor chip placed on an upper layer. In this manner, the semiconductor chips that are adjacent to each other in the vertical direction are electrically connected.

According to the present embodiment, the reason why no penetrating electrode TSV is provided on the top-layer core chip CC0 is because there is no need to form a bump electrode on the back-surface side of the core chip CC0 as the chips are stacked by the face-down manner. If no penetrating electrode TSV is provided on the top-layer core chip CC0 as described above, the top-layer core chip CC0 can be made thicker than the other core chips CC1 to CC3 to increase the mechanical strength of the core chip CC0. Alternatively a penetrating electrode TSV may be provided on the top-layer core chip CC0. In this case, all the core chips CC0 to CC3 can be produced by the same process.

The core chips CC0 to CC3 are semiconductor chips made by removing the so-called front-end section, which serves as an interface with the outside, from circuit blocks contained in a typical SDRAM (Synchronous Dynamic Random Access Memory) that operates alone. In other words, the core chips CC0 to CC3 are memory chips on which only circuit blocks belonging to the back-end section are integrated. Among the circuit blocks contained in the front-end section, there are a parallel-to-serial conversion circuit, which performs parallel-to-serial conversion of input/output data between a memory cell array and a data input/output terminal, a DLL (Delay Locked Loop) circuit, which controls an input/output timing of data, and the like.

Meanwhile, the interface chip IF is a semiconductor chip on which only circuit blocks of the front-end section are integrated, among circuit blocks contained in a typical SDRAM that operates alone. The interface chip IF functions as a common front-end section for the four core chips CC0 to CC3. A11 accesses from the outside are conducted through the interface chip IF, and inputting and outputting of data are performed through the interface chip IF.

The interposer IP is a circuit board made of resin. On a back surface IPb thereof, a plurality of external terminals (solder balls) SB are formed. The interposer IP ensures the mechanical strength of the semiconductor device 10 and functions as a redistribution substrate to expand an electrode pitch. That is, substrate electrodes 91 that are formed on a top surface IPa of the interposer IP are led out to the back surface IPb via through-hole conductors 92; rewiring layers 93 that are provided on the back surface IPb are designed to expand the pitch of the external terminals SB. The areas of the top surface IPa of the interposer IP where no substrate electrode 91 is formed are covered with resist 90a. The areas of the back surface IPb of the interposer IP where no external terminal SB is formed are covered with resist 90b. FIG. 1 shows only five external terminals SB. However, a large number of external terminals is actually provided. The layout of the external terminals SB is the same as that of a SDRAM determined by the standard.

Accordingly, an external controller can handle the external terminals SB as those of one SDRAM.

The gaps between the core chips CC0 to CC3 and interface chip IF stacked are filled with underfill 94. In this manner, the mechanical strength is ensured. The gap between the interposer IP and the interface chip IF is filled with NCP (Non-Conductive Paste) 95. The entire package is covered with mold resin 96. In this manner, each chip is physically protected.

The penetrating electrodes TSV provided in the core chips CC1 to CC3 and interface chip IF are arranged at a slightly wider pitch P0 than the minimum pitch PF, in order to avoid an increase in the chip size. When the minimum pitch PF is 30 µm, the value of the pitch P0 is for example about 40 to 50 µm. Meanwhile, the substrate electrodes 91 provided on the interposer IP are arranged at a minimum pitch P1 (>P0) that is allowed according to a wiring rule of the interposer IP, or at a slightly wider pitch P1 (>P0) than the minimum pitch. The value of the pitch P1 is for example about 75 to 150 µm. FIG. 1 shows eight penetrating electrodes TSV, which are arranged in lines T1 to T8 in the core chips CC1 to CC3 and interface chip IF, as well as six top-surface bumps FB, which are arranged in lines T1 and T0 to T12 in the interface chip IF. However, greater numbers of penetrating electrodes TSV and top-surface bumps FB are actually provided. As shown in FIG. 1, the top-surface bumps FB provided on the interface chip IF are bonded to the substrate electrodes 91 on the interposer IP. However, as shown in FIG. 1, some of the top-surface bumps FB provided on the interface chip IF are not bonded to the substrate electrodes 91 on the interposer IP.

Most of the penetrating electrodes TSV provided on the core chips CC1 to CC3 are connected to the top-surface bumps FB and back-surface bumps BB that are provided at the same locations in planar view. According to the present embodiment, the penetrating electrodes of such a kind are represented by TSV1. In FIG. 1, the penetrating electrodes TSV1 of such a kind are shown in lines T1 to T8.

Figure 2:
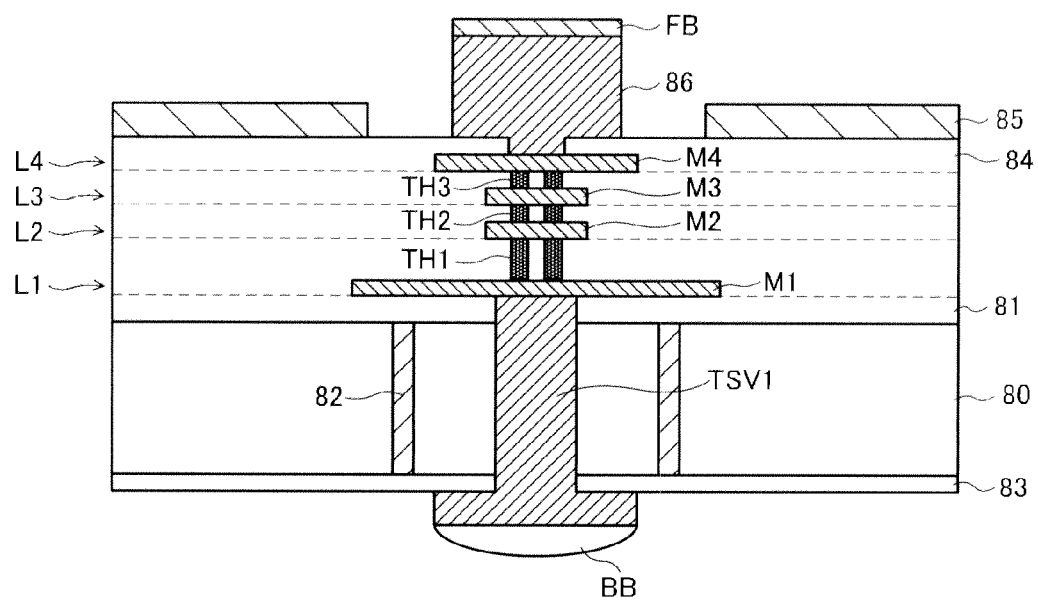
FIG. 2 is a cross-sectional view of a penetrating electrode TSV1.

Turning to FIG. 2, the penetrating electrode TSV1 is so provided as to pass through a silicon substrate 80, an interlayer insulation film 81, which is provided on a top surface of the silicon substrate 80, and a passivation film 83, which is provided on a back surface of the silicon substrate 80. Although not specifically limited, the penetrating electrode TSV1 is made of Cu (copper). The top surface of the silicon substrate 80 serves as a device formation surface on which devices such as transistors and a multi-level wiring structure including wiring layers L1 to L4 are formed. Around the penetrating electrode TSV1, insulation rings 82 are provided to insulate the penetrating electrode TSV1 from a transistor region. Instead of providing the insulation ring 82, an insulation film such as silicon oxide film can be provided on the inner wall of a through-substrate via that is to be filled by the penetrating electrode TSV.

An end portion of the penetrating electrode TSV1 that is closer to the back surface of the silicon substrate 80 is covered with a back-surface bump BB. In the core chips CC1 to CC3, the back-surface bumps BB are in contact with the top-surface bumps FB provided on upper-layer core chips CC0 to CC2, respectively. In the interface chip IF, the back-surface bumps BB are in contact with the top-surface bumps FB provided on the core chip CC3. Although not specifically limited, the back-surface bumps BB are made of SnAg solder, which covers the surfaces of the penetrating electrodes TSV1 made of Cu (copper). The top-surface bump FB is connected to an end portion of the penetrating electrode TSV1 via interconnection pads (conductive patterns) M1 to M4, which are provided respectively as the wiring layers L1 to L4, and a plurality of through-hole conductors TH1 to TH3, which connect the interconnection pads. In the core chips CC1 to CC3, the top-surface bumps FB are in contact with the back-surface bumps BB provided on the lower-layer core chips CC2 and CC3 and the interface chips IF, respectively. In the interface chip IF, the top-surface bumps FB are in contact with the substrate electrodes 91 on the interposer IP. Although not specifically limited, the top-surface bumps FB include a pillar portion 86 that is made of Cu (copper). A surface of the pillar portion 86 includes a structure in which layers of Ni (nickel) and Au (gold) are stacked. The diameter of the top-surface bumps FB and back-surface bumps BB is about 20 µm.

According to the above configuration, the top-surface bumps FB and back-surface bumps BB that are provided at the same locations in planar view are being short-circuited via the penetrating electrodes TSV1. The pillar portion 86 of a top-surface bump FB is so provided as to pass through a passivation film 84. A top surface of the passivation film 84 except a region where the top-surface bump FB is formed is covered with a polyimide film 85. Incidentally, the connection to internal circuits not shown in the diagram is realized via interconnection lines (not shown), which are led out from the interconnection pads M1 to M3 provided in the wiring layers L1 to L3. In the present specification, the wiring layers L1 to L4 and insulating films intervening therebetween may be referred to as a multi-level wiring structure.

In that manner, the penetrating electrodes TSV1 are connected to the top-surface bumps FB and back-surface bumps BB that are provided at the same locations in planar view. Accordingly, input signals (command signals, address signals, and other signals) that are supplied from the interface chip IF via the penetrating electrodes TSV1 are input into the core chips CC0 to CC3 in common. Output signals (such as data) that are supplied from the core chips CC0 to CC3 via the penetrating electrodes TSV1 are subjected to a Wired-OR operation before being input into the interface chip IF.

Incidentally, in the interface chip IF, the penetrating electrodes TSV1 of such a kind are partially provided. FIG. 1 shows the penetrating electrodes TSV1 provided in lines T1 and T8 of the interface chip IF. The penetrating electrodes TSV1 provided on the interface chip IF are used mainly for supplying power supply potential VDD or VSS.

Most of the penetrating electrodes TSV provided on the interface chip IF are connected to the back-surface bumps BB that are provided at the same locations in planar view, but not connected to the top-surface bumps FB that are provided at the same locations in planar view. According to the present embodiment, the penetrating electrodes of such a kind are represented by TSV2. In FIG. 1, the penetrating electrodes TSV2 provided on the interface chip IF are shown in lines T2 to T7.

Figure 3:
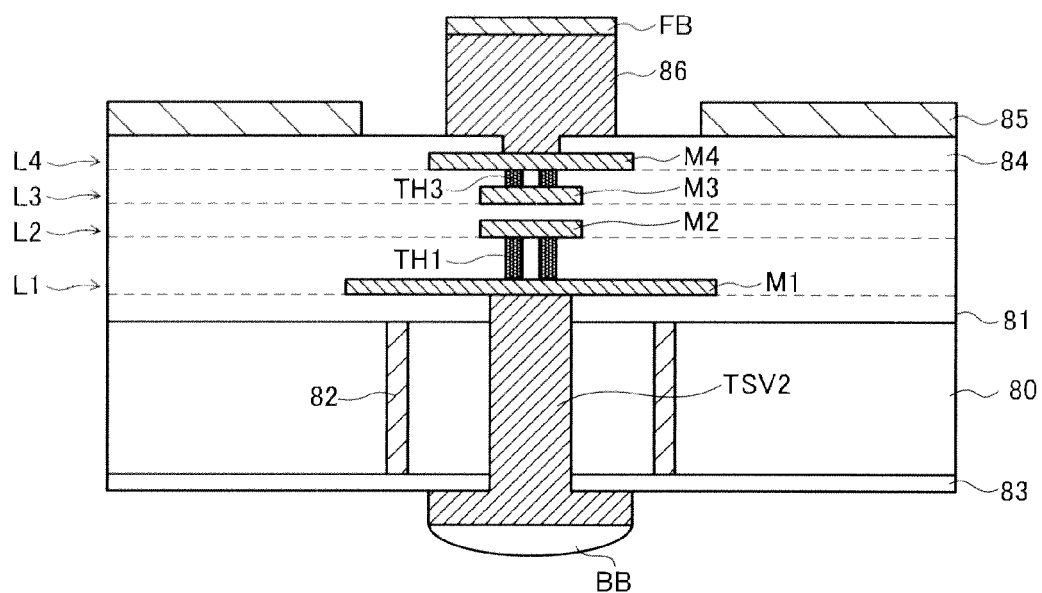
FIG. 3 is a cross-sectional view of a penetrating electrode TSV2.

Turning to FIG. 3, the penetrating electrode TSV2 is different from the penetrating electrode TSV1 shown in FIG. 2 in that a through-hole conductor TH2, which is designed to connect the interconnection pads M2 and M3 placed at the same plane position, has been removed. Therefore, the top-surface bump FB and back-surface bump BB that are placed at the same plane position are not short-circuited. The penetrating electrodes TSV2 provided on the interface chip IF are used mainly for transmitting or receiving signals. That is, signals output from the internal circuits (not shown) in the interface chip IF are supplied to the interconnection pad M1 or M2, and are supplied to the core chips CC0 to CC3 via the back-surface bumps BB. Signals output from the core chips CC0 to CC3 are supplied to the interconnection pad M1 or M2 the back-surface bumps BB, and are input into the internal circuits (not shown) in the interface chip IF. The penetrating electrodes TSV2 are electrodes that are bonded to the top surface bumps FB provided on the core chip CC3. Therefore, the array pitch thereof is so designed as to be P0.

Figure 4:
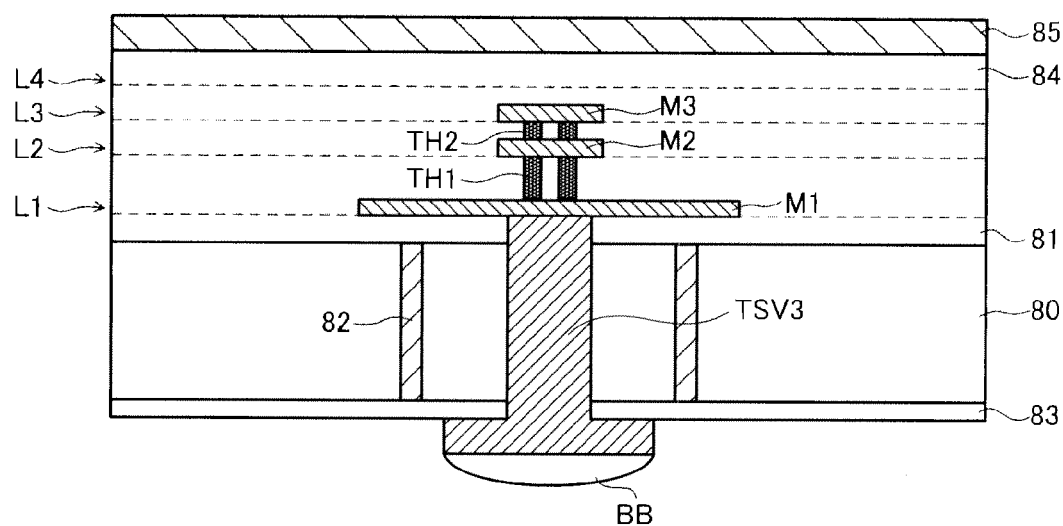
FIG. 4 is a cross-sectional view of a penetrating electrode TSV3.

Incidentally, the top-surface bumps FB of the penetrating electrodes TSV2 shown in lines T2 to T7 are not bonded to the substrate electrodes 91 on the interposer IP. In such a case, there is no need to provide the top-surface bumps FB; as in the case of a penetrating electrode TSV3 shown in FIG. 4, the top-surface bumps FB may be removed.

Although not shown in the diagram, some of the above-described penetrating electrodes TSV2 are used in the core chips CC1 to CC3. The penetrating electrodes TSV2 provided on the core chips CC1 to CC3 are used to sequentially transfer predetermined information to the internal circuits (not shown) provided on each of the core chips CC0 to CC3, and to input unique information. The information includes chip select signal, defective chip information, and the like.

Furthermore, on the interface chip IF, top-surface bumps FBa on which penetrating electrodes TSV are not provided at the same plane positions are provided, too. In FIG. 1, the top-surface bumps FBa provided on the interface chip IF are shown in Lines T9 to T12.

Figure 5:
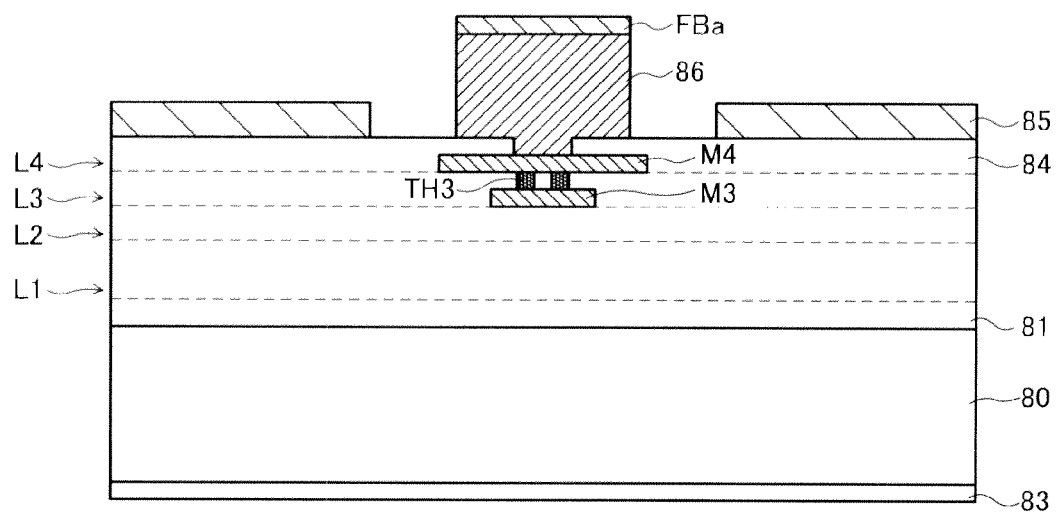
FIG. 5 is a cross-sectional view of a top-surface bump shown in FIG. 1.

Turning to FIG. 5, the top-surface bump FBa provided on the interface chip IF is connected to the interconnection pads M4 and M3. Below the interconnection pads M4 and M3, the interconnection pads M2 and M1, the penetrating electrodes TSV, and the back-surface bump BB are not provided. The interconnection pads M4 and M3 are connected to logic circuits and other circuits in the interface chip IF, which are not shown in the diagram. The top-surface bump FBa is an electrode bonded to a substrate electrode 91 on the interposer IP. Therefore, the array pitch thereof is so designed as to be P1.

A procedure of producing the semiconductor device 10 shown in FIG. 1 will be described below. First, the core chip CC0 is placed on a stage of a flip chip bonder in a face-up manner. The position thereof is recognized with the help of an alignment mark put on the surface of the chip. Then, a flip chip bonding tool is used to pick up the principal surface of the core chip CC1, or the surface on which the top-surface bumps FB are formed. The position of the core chip CC1 that is picked up is recognized with the help of an alignment mark put on the back surface thereof. After the positions of the core chips CC0 and CC1 have been recognized, the core chip CC1 is stacked on the core chip CC0 in a face-up manner in such a way that the top-surface bumps FB of the core chip CC0 are accurately placed on the back-surface bumps BB of the core chip CC1.

Then, the position of the core chip CC1 is recognized with the help of an alignment mark put on the surface of the chip. A flip chip bonding tool is used to pick up the core chip CC2. The same procedure is used to stack the core chip CC2 on the core chip CC1 in a face-up manner. Similarly, the core chip CC3 and the interface chip IF are stacked in that order.

After the interface chip IF is stacked, in order to fill the gaps between the chips, the underfill 94 is injected from the sides. Then, pressurization baking or the like is performed to cure the underfill 94.

Then, the substrate electrodes 91 are formed on the top surface IPa of the interposer IP. For example, it is preferred that stud bump made of gold (Au) be used as the substrate electrodes 91. Then, on a stage of a flip chip bonder, the interposer IP is placed, and the NCP (Non-Conductive Paste) 95 is applied to the top surface IPa on which the substrate electrodes 91 are formed. In this state, a laminated body made up of the core chips CC0 to CC3 and the interface chip IF, which is prepared in advance, is stacked on the interposer IP in such a way that the top-surface bumps FB are accurately placed on the substrate electrodes 91. Then, a process of heating the NCP 95 or any other process is performed to cure the NCP 95. After that, all the components are covered with the mold resin 96, and external terminals (solder balls) SB are formed on the back surface IPb of the interposer IP. In this manner, the semiconductor device 10 shown in FIG. 1 is completed.

The alignment marks on the principal surface side of each of the core chips CC0 to CC3 are made up of the interconnection pads M4 provided on the top wiring layer L4. The alignment marks on the back surface side of each of the core chips CC1 to CC3 and interface chip IF are made up of the back-surface bumps BB integrally with the penetrating electrodes TSV3. No alignment mark is required on the back surface's side of the core chip CC0. Hereinafter, the configuration of the core chips CC1 to CC3 will be described in detail with a focus on the alignment marks.

Figure 6:
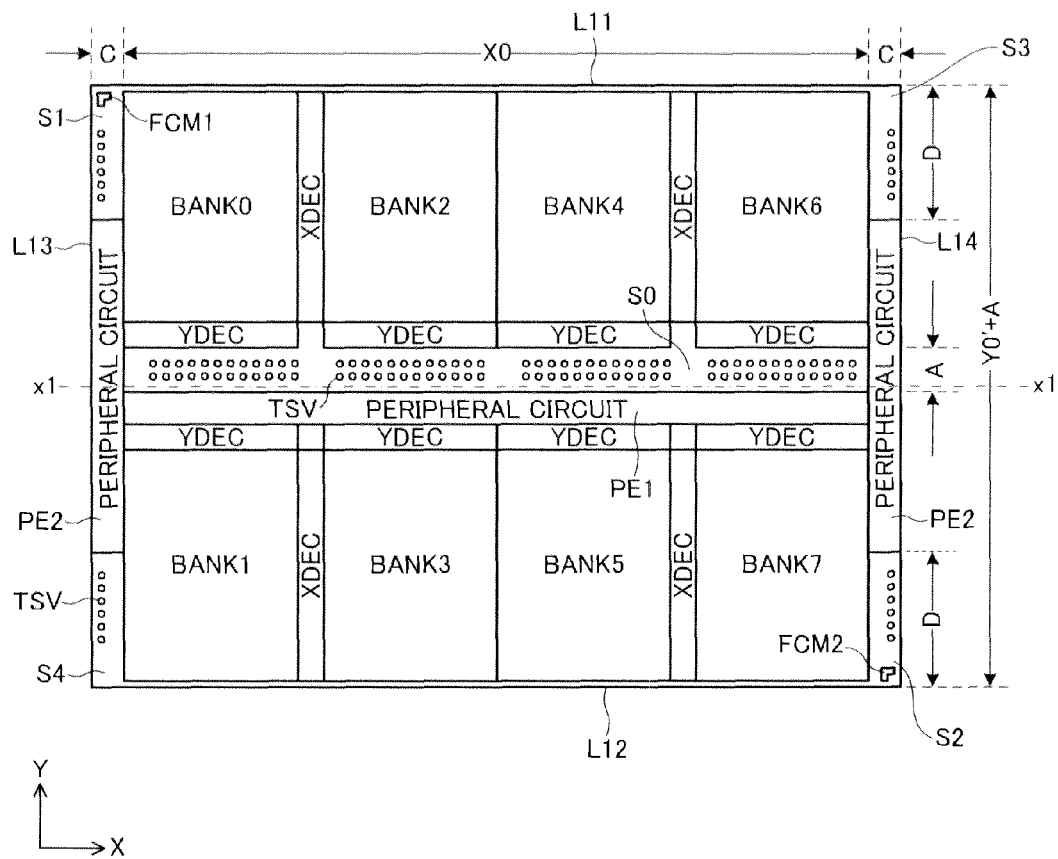
FIG. 6 is a schematic top view of a layout of a principal surface side of each of core chips CC1 to CC3 shown in FIG. 1.
Figure 7:
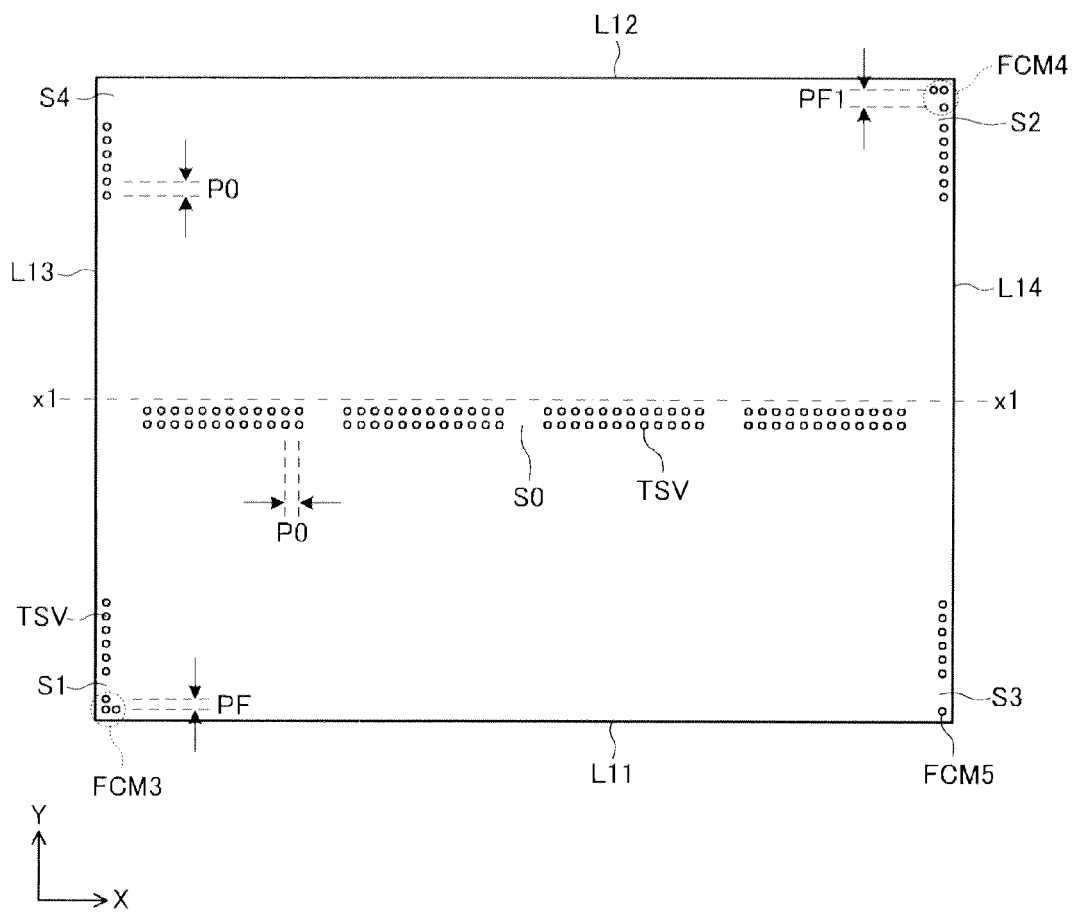
FIG. 7 is a schematic top view of a layout of a back surface side of each of the core chips CC1 to CC3 shown in FIG. 1.

FIG. 6 is a layout of a principal surface side of each of the core chips CC1 to CC3 and FIG. 7 is a layout of a back-surface side of each of the core chips CC1 to CC3. Incidentally, the layout shown in FIG. 7 is rotated a layout showed in FIG. 6 by 180 degrees around line x1-x1 turns out.

Turning to FIG. 6, the core chips CC1 to CC3 each have eight memory banks BANK0 to BANK7. The even-numbered memory banks BANK0, 2, 4, and 6 are disposed in an X-direction along one side L11 in a Y-direction of each of the core chips CC1 to CC3. The odd-numbered memory banks BANK 1, 3, 5, and 7 are disposed in the X-direction along the other side L12 in the Y-direction of each of the core chips CC1 to CC3. Moreover, between the banks that are adjacent to each other in the X-direction, row decoders XDEC are disposed to perform row access. Between the banks that are adjacent to each other in the Y-direction, column decoders YDEC are disposed to perform column access.

In a central portion of the chip in the Y-direction, so-called peripheral circuits PE1 are disposed. The peripheral circuits PE1 include a logic circuit, a power supply circuit, an input/output circuit, and the like. In regions S0 between the peripheral circuits PE1 and the column decoders YDEC which is located on the memory banks BANK0, 2, 4, and 6 side, a large number of penetrating electrodes TSV are disposed. The penetrating electrodes TSV disposed in the regions S0 are mainly made up of penetrating electrodes for power supply, and penetrating electrodes for signals. For the penetrating electrodes TSV for power-supply, penetrating electrodes TSV1 having the configuration shown in FIG. 2 are used. For the penetrating electrodes TSV for signal, penetrating electrodes TSV1 having the configuration shown in FIG. 2 or penetrating electrodes TSV2 having the configuration shown in FIG. 3 are used.

In regions that are substantially positioned at the center along sides L13 and L14 that extend in the Y-direction of each of the core chips CC1 to CC3, peripheral circuits PE2 are arranged. The peripheral circuits PE2 include a DFT logic circuit, a power supply circuit, and the like. In regions S1 to S4 that are positioned on both sides of each of the peripheral circuits PE2, support penetrating electrodes TSV are provided. The support penetrating electrodes TSV are so provided as to prevent the gaps between the chips from becoming narrower due to warping of the chips. For the support penetrating electrodes TSV, the penetrating electrodes TSV1 having the configuration shown in FIG. 2 are used.

At corners of the chips that belong to the regions S1 and S2, top-surface alignment marks FCM1 and FCM2 are provided on the principal surface's side. On the back surface's side, back-surface alignment marks FCM3 and FCM4 are provided. The regions S1 and S2 are positioned at diagonally opposite corners of the chip.

The planar shape of each of the top-surface alignment marks FCM1 and FCM2 is a L-shape, each having the same shape and direction. Accordingly, if the positions of the core chips CC1 to CC3 are recognized from the principal surfaces' sides by means of images, the positions and directions of the chips can be determined. The reason why the directions of the chips can be determined is that both the top-surface alignment marks FCM1 and FCM2 have the same direction; and that, if the chips are rotated by 180 degrees in a plane, both the directions of the top-surface alignment marks FCM1 and FCM2 are inverted.

Each of the back-surface alignment marks FCM3 and FCM4 is made up of three penetrating electrodes TSV that are arranged in a L-shape. According to the present invention, a plurality of penetrating electrodes TSV that make up the back-surface alignment marks may be referred to as "first penetrating electrodes or fourth penetrating electrodes". A plurality of penetrating electrodes TSV that are disposed in the region S0 and used for inputting or outputting corresponding signals may be referred to as "second penetrating electrodes". A plurality of support penetrating electrodes TSV that are disposed in the regions S1 to S4 may be referred to as "third penetrating electrodes".

As shown in FIG. 7, unlike the top-surface alignment marks FCM1 and FCM2, the direction of the back-surface alignment mark FCM3 is 180 degrees different from the direction of the back-surface alignment mark FCM4 as a result of rotation in a plane. However, according to the present embodiment, in the back-surface alignment marks FCM3 and FCM4, the pitches of some of the penetrating electrodes TSV are different. Accordingly, if the positions of the core chips CC1 to CC3 are recognized from the back surfaces' sides by means of images, the positions and directions of the chips can be determined. The shape of the back-surface alignment marks FCM3 and FCM4 will be detailed later.

At a corner of the chip that belongs to the region S3, an auxiliary alignment mark FCM5 is provided on the back surface's side. The auxiliary alignment mark FCM5 is made up of one penetrating electrode TSV; and a similar auxiliary alignment mark is not provided in the region S4 that is positioned at a diagonally opposite corner from the region S3. Therefore, the auxiliary alignment mark FCM5 is used as auxiliary alignment mark for recognizing a rotation angle in a plane of the chip. Such an auxiliary alignment mark FCM5 may not be provided. However, as mentioned above, the directions of the back-surface alignment marks FCM3 and FCM4 are the same, and the back-surface alignment marks FCM3 and FCM4 are only slightly different in shape. In some cases, it may be impossible to recognize whether or not the chips have been rotated by 180 degrees in a plane. According to the present embodiment, in order to prevent such misrecognition, the auxiliary alignment mark FCM5 is provided.

Figures 8A, 8B:
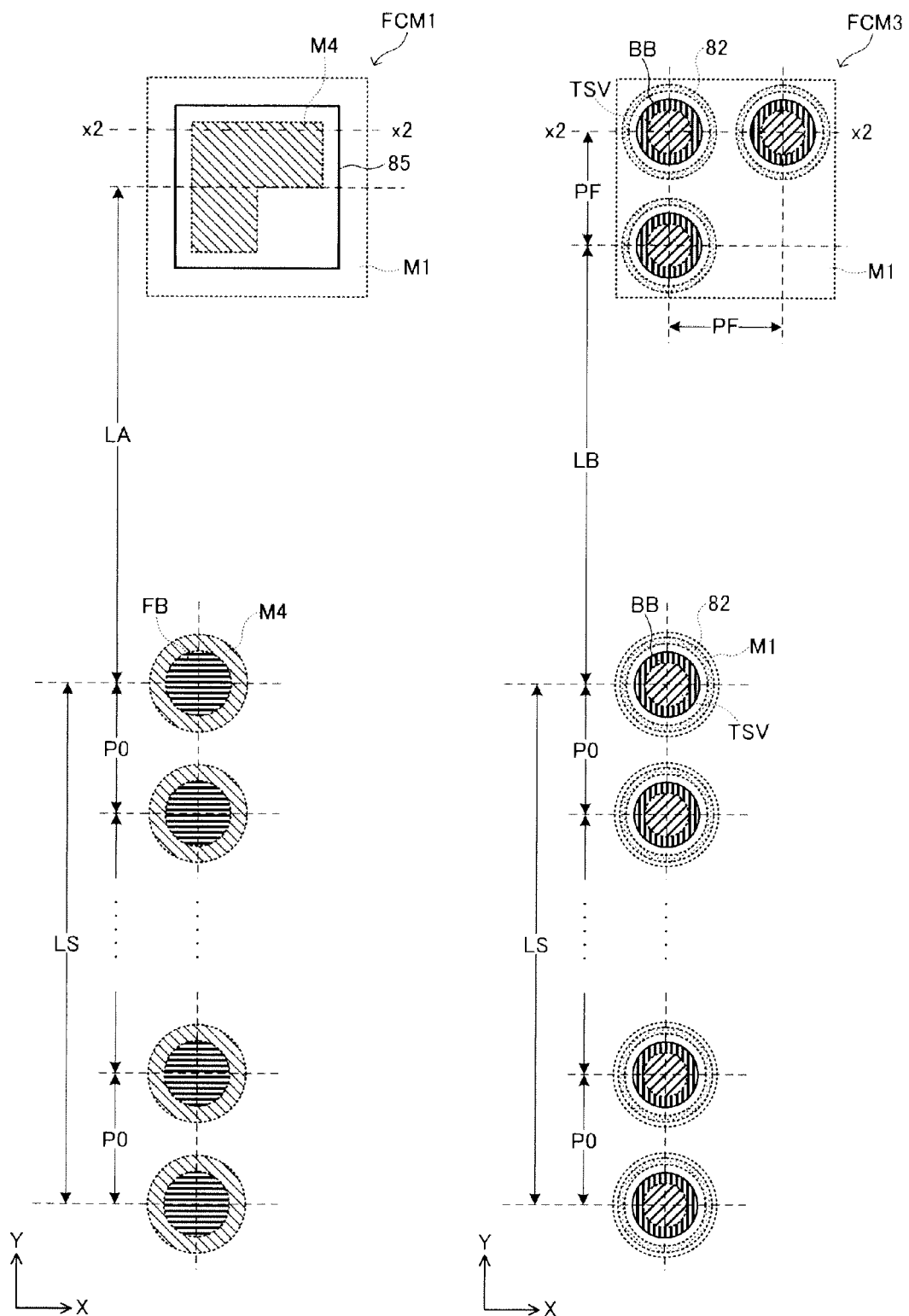
FIGS. 8A and 8B are top views of layouts of penetrating electrodes TSV and alignment marks FCM1 and FCM3 provided in a region S1 shown in FIGS. 6 and 7 where

Turning to FIGS. 8A and 8B, in order to make the diagrams easy-to-understand, the layout of FIG. 8B shows the layout of the back surface seen through from the principal surface's side. Accordingly, the layout of the back surface seen from the back surface's side is actually 180 degrees different. The same is true for FIGS. 10 to 12 described later.

As shown in FIGS. 8A and 8B, the support penetrating electrodes TSV provided in the region S1 are disposed in a row at an array pitch of P0 over length LS. The array pitch P0 is slightly wider than a minimum pitch PF that can be processed. The length LS is determined based on the number of penetrating electrodes TSV necessary to stabilize the gaps between the chips. The length LS is, for example, about 200 μm to 1,000 μm.

At the corner of the chip that belongs to the region S1, the top-surface alignment mark FCM1 is provided on the principal surface's side, and the back-surface alignment mark FCM3 on the back surface's side. According to the present embodiment, the top-surface alignment mark FCM1 and the back-surface alignment mark FCM3 are so disposed as to overlap with each other in planar view. However, the configuration is not considered essential. However, in the region where the back-surface alignment mark FCM3 is provided, transistors, wires, and the like cannot be disposed. If the top-surface alignment mark FCM1 is so disposed as to overlap in planar view, the area of the chip can be effectively utilized.

Figure 9:
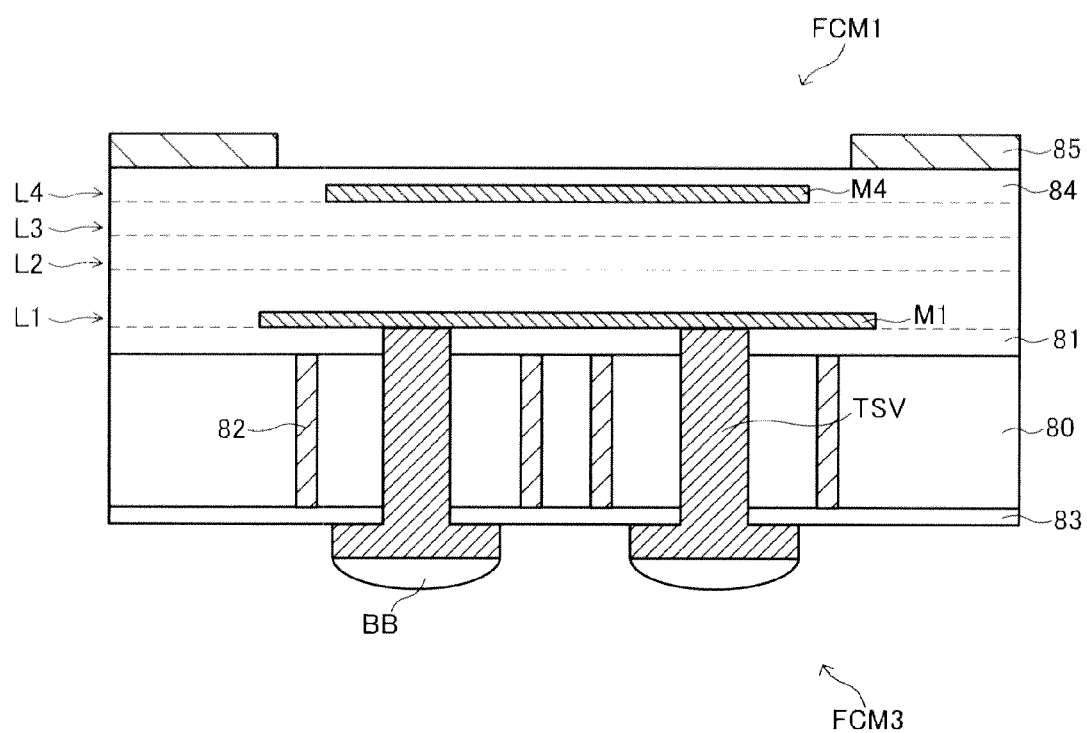
FIG. 9 is a cross-sectional view of FIGS. 8A and 8B taken along line x2 to x2.

Turning to FIGS. 8A and 9, the top-surface alignment mark FCM1 is made up of the interconnection pad M4, which is provided as the top wiring layer L4 of the multi-level wiring structure. The top-surface alignment mark FCM1 is not an electrode connected to the top-surface bump FB. However, in order to make it easier to be viewed from the principal surface's side, in the formation region of the interconnection pad M4, the polyimide film 85 is removed. Moreover, if the background pattern of the interconnection pad M4 is uneven, the background pattern becomes an obstacle for image recognition. Therefore, the entire interconnection pad M4 is covered with the interconnection pad M1 (which is formed as the bottom wiring layer of the multi-level wiring structure) in planar view. In this manner, the interconnection pad M1 helps to make the background pattern of the interconnection pad M4 even, thereby making it possible to perform accurate image recognition.

Meanwhile, as shown in FIG. 8B, the back-surface alignment mark FCM3 is made up of the back-surface bumps BB, which are end portions of the three penetrating electrodes TSV. The shape and size of each of the penetrating electrodes TSV that make up the back-surface alignment mark FCM3 are the same as the shape and size of other penetrating electrodes TSV, such as the signal or power-supply penetrating electrodes TSV disposed in the region S0, or the support penetrating electrodes TSV disposed in the regions S1 to S4. However, at positions that overlap in planar view with the penetrating electrodes TSV that make up the back-surface alignment mark, no top-surface bump FB is provided.

The three penetrating electrodes TSV are laid out respectively at corners of an right triangle. The pitch between the two penetrating electrodes TSV adjacent to each other in the X-direction and Y-direction are so designed as to be minimum array pitch PF that can be processed. The first reason why the penetrating electrodes TSV are laid out at a minimum array pitch of PF is to make the pattern shape of the penetrating electrodes TSV different from the pattern of other penetrating electrodes TSV such as those for signals or power supply. The second reason is to reduce the area occupied by the alignment mark FCM3. In order to prevent misrecognition of the back-surface alignment mark FCM3, it is preferred that the distance LB shown in FIG. 8B is set to a value not divisible by PF and P0. In one example, for PF =35 μm and P0=40 μm, LB=135 μm and LS=600 μm are possible. In this case, the distance LA shown in FIG. 8A is for example 152.5 μm. The distance LA is the distance from the center of the top-surface alignment mark FCM1 to the center of the nearest support penetrating electrode TSV.

As shown in FIGS. 8B and 9, the three penetrating electrodes TSV that make up the back-surface alignment mark FCM3 are connected in common to the interconnection pad M1 provided as the wiring layer L1 after passing through the following: a silicon substrate 80, an interlayer insulation film 81 that is provided on a top surface of the silicon substrate 80, and a passivation film 83 that is provided on a back surface of the silicon substrate 80. The interconnection pad M1 functions as an etching stopper at a time when through-holes for the penetrating electrodes TSV are formed in the silicon substrate 80. It is unnecessary to electrically separate the three penetrating electrodes TSV that make up the back-surface alignment mark FCM3 from one another. Moreover, as mentioned above, if the top-surface alignment mark FCM1 and the back-surface alignment mark FCM3 are so disposed as to overlap with each other in planar view, it is preferred that the entire interconnection pad M4 be covered with the interconnection pad M1. Therefore, the three penetrating electrodes TSV that make up the back-surface alignment mark FCM3 are connected in common to the same interconnection pad M1.

Figure 10A:
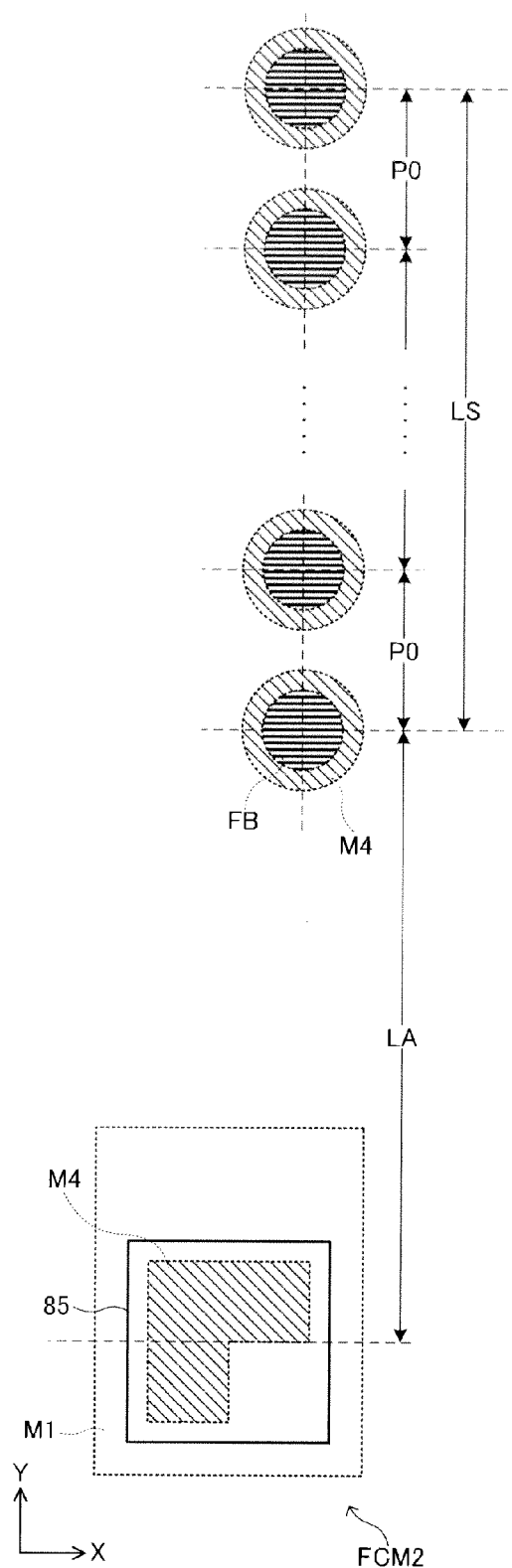
FIGS. 10A and 10B are top views of layouts of the penetrating electrodes TSV and alignment marks FCM2 and FCM4 disposed in a region S2 shown in FIGS. 6 and 7 where

Turning to FIG. 10A, the shape of the top-surface alignment mark FCM2 is the same as the shape of the top-surface alignment mark FCM1 shown in FIG. 8A. However, the planar shape of the back-surface alignment mark FCM4 that is positioned on the back surface thereof is extended in the Y-direction. The planar shape of the interconnection pad M1 that is so provided as to overlap with the interconnection pad M4 is extended in the Y-direction accordingly.

Figure 10B:
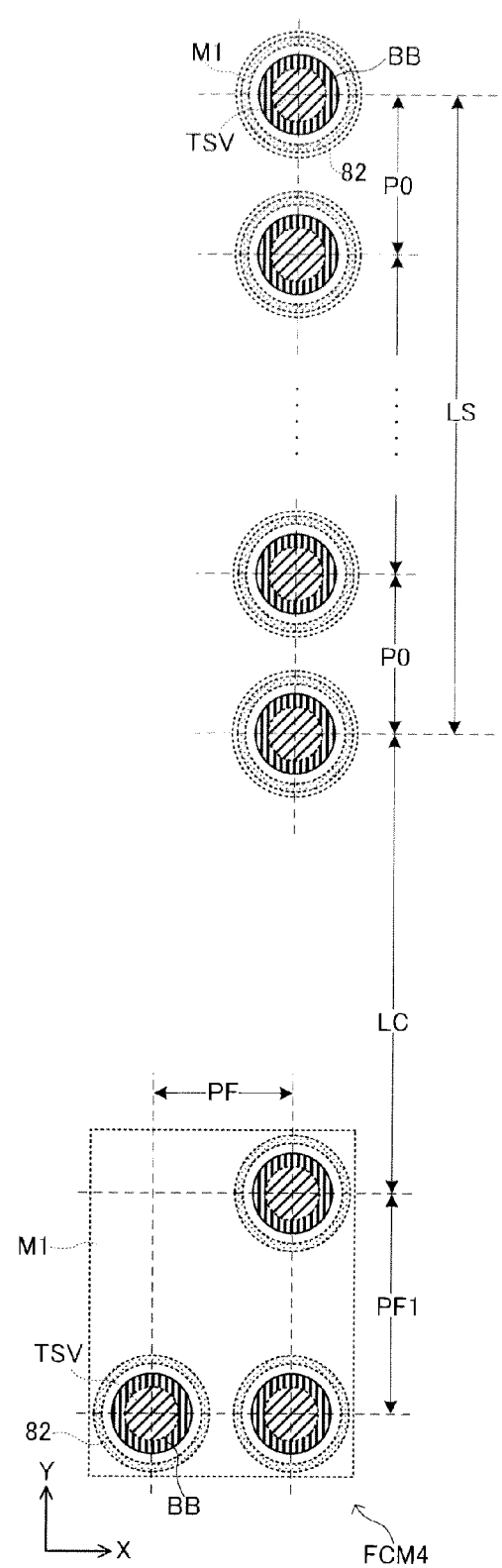

Turning to FIG. 10B, the back-surface alignment mark FCM4 is made up of the back-surface bumps BB, which are end portions of the three penetrating electrodes TSV as in the case of the above-described back-surface alignment mark FCM3. The three penetrating electrodes TSV that make up the back-surface alignment mark FCM4 are laid out respectively at corners of a right-angled triangle that is not isosceles. The shape and size of each of the penetrating electrodes TSV that make up the back-surface alignment mark FCM4 are the same as the shape and size of other penetrating electrodes TSV, such as the signal or power-supply penetrating electrodes TSV disposed in the region S0, or the support penetrating electrodes TSV disposed in the regions S1 to S4.

The three penetrating electrodes TSV are laid out in a L-shape. The pitch between the two penetrating electrodes TSV adjacent to each other in the X-direction is so designed as to be minimum array pitch PF. Meanwhile, the pitch between the two penetrating electrodes TSV adjacent to each other in the Y-direction is so designed as to be array pitch PF1, which is larger than minimum array pitch PF. The reason is that, if the chips are rotated by 180 degrees, the back-surface alignment mark FCM4 can be distinguished from the back-surface alignment mark FCM3. According to the present embodiment, the direction of the arrangement pattern of the three penetrating electrodes TSV that make up the back-surface alignment mark FCM3 is rotated by 180 degrees from the direction of the arrangement pattern of the three penetrating electrodes TSV that make up the back-surface alignment mark FCM4.

According to the present embodiment, the reason why the direction of the back-surface alignment mark FCM3 is rotated by 180 degrees from the direction of the back-surface alignment mark FCM4 is as follows. If the back-surface alignment marks FCM3 and FCM4 face the same direction as in the case of the top-surface alignment marks FCM1 and FCM2, two penetrating electrodes TSV in the back-surface alignment mark FCM3 or FCM4 need to be disposed at the central side of the chip, not at the end portion's side of the chip. A transistor formed on the silicon substrate 80 needs to be placed a certain distance away from the penetrating electrodes TSV to prevent changes in characteristics. If the two penetrating electrodes TSV are disposed at the central side of the chip, a region where a transistor can be formed is reduced accordingly. To solve the problem, according to the present embodiment, the two penetrating electrodes TSV in both the back-surface alignment marks FCM3 and FCM4 are disposed at the end portion's side of the chip, and one penetrating electrode TSV at the central side of the chip. As a result, the back-surface alignment marks FCM3 and FCM4 have shapes that are rotated by 180 degrees from each other.

If the shape of the back-surface alignment marks FCM3 and FCM4 are exactly the same, the back-surface alignment marks FCM3 and FCM4 cannot be recognized when the direction of the chip is rotated by 180 degrees. To solve the problem, according to the present embodiment, in the back-surface alignment mark FCM4, the distance between the two penetrating electrodes TSV adjacent to each other in the Y-direction is array pitch PF1. As a result, the back-surface alignment mark FCM4 can be distinguished from the back-surface alignment mark FCM3. It is preferred that array pitch PF1 be different from array pitch P0; misrecognition of the back-surface alignment mark FCM4 is prevented as a result. In one example, for PF=35 µm and P0=40 µm, then PF1=55 µm are possible. In this case, the distance LC shown in FIG. 10B is 110 µm.

Figure 11A:
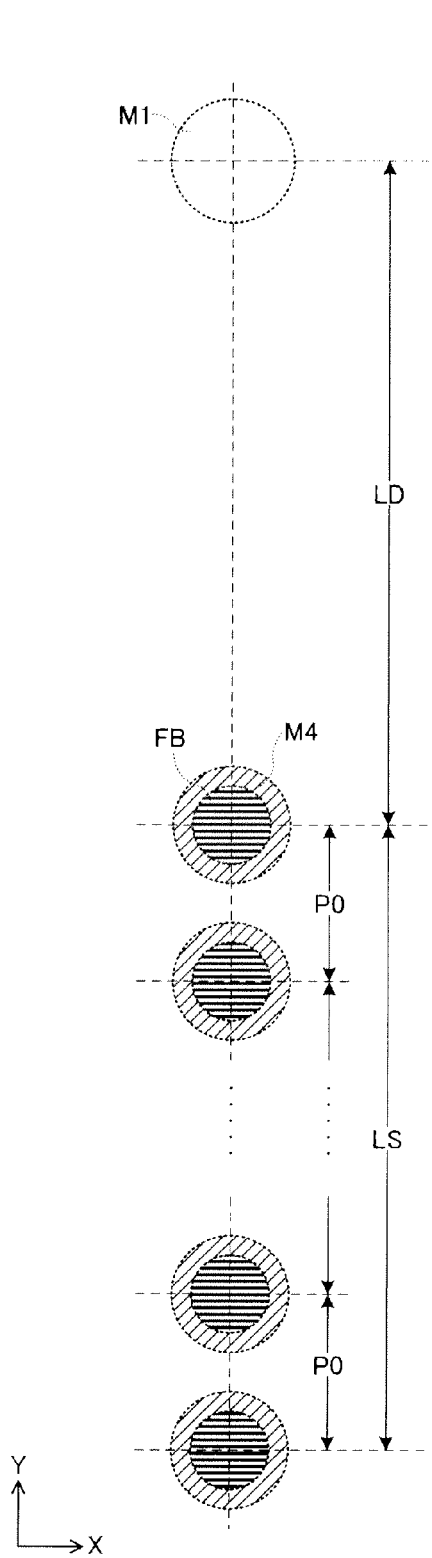
FIGS. 11A and B are top views showing layouts of the penetrating electrodes TSV and alignment mark FCM5 provided in a region 53 shown in FIGS. 6 and 7 where
Figure 11B:
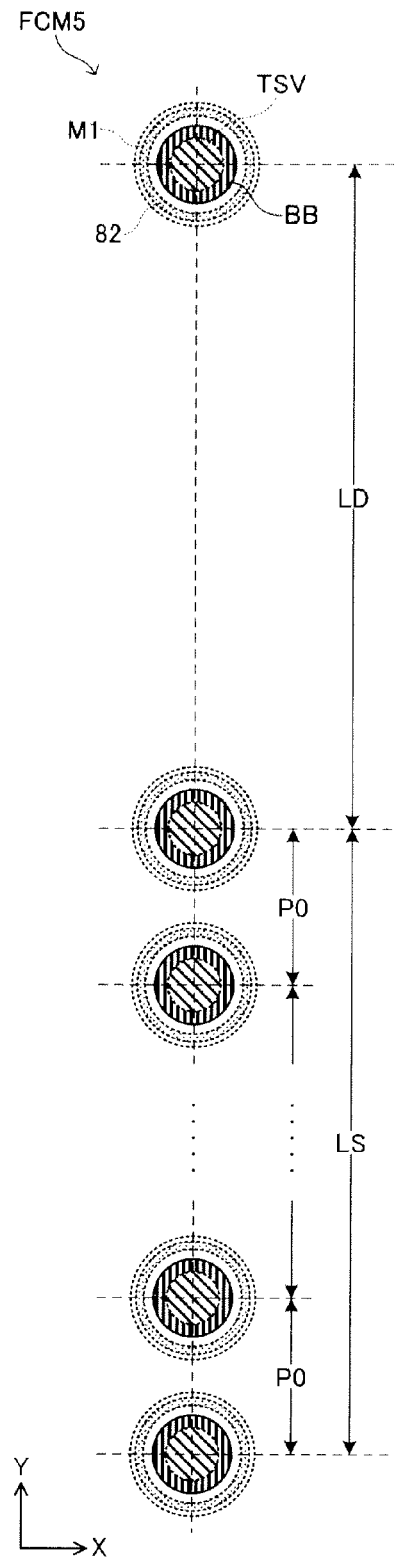
FIG. 11B shows a layout of the back surface.

Turning to FIG. 11B, at the corner of the region S3, the auxiliary alignment mark FCM5, which is made up of one penetrating electrode TSV, is disposed. In an area of the principal surface's side that overlaps with the auxiliary alignment mark FCM5 in planar view, no top-surface bump FB is formed. The distance LD shown in FIGS. 11A and 11B is for example 170 µm.

Figure 12A:
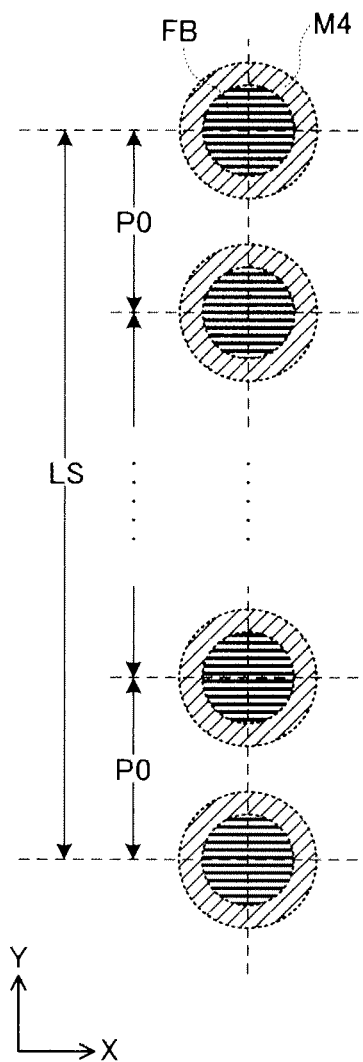
FIGS. 12A and B are top views showing layouts of the penetrating electrodes TSV provided in a region S4 shown in FIGS. 6 and 7 where
Figure 12B:
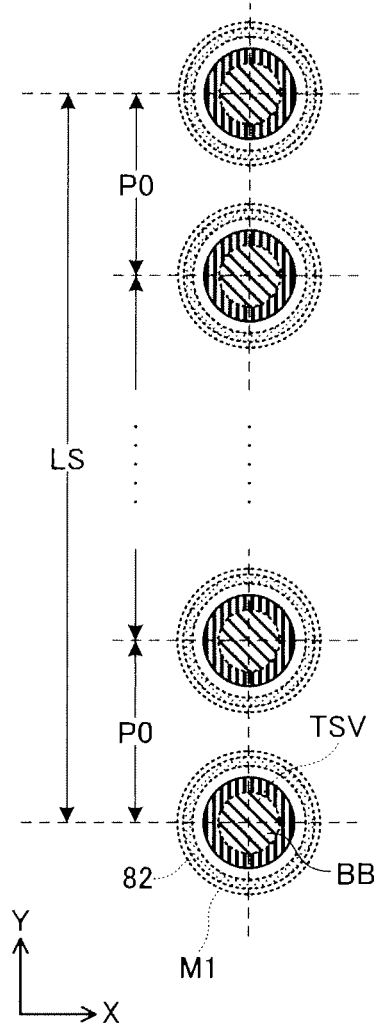
FIG. 12B shows a layout of the back surface.

Turning to FIGS. 12A and 12B, in the region S4, no alignment mark is provided; the support penetrating electrodes TSV are arranged.

The above has described the configuration of the core chips CC1 to CC3. Incidentally, the top-layer core chip CC0 basically has the same configuration as the core chips CC1 to CC3. However, as described above, in the core chip CC0, no penetrating electrodes TSV are provided. Accordingly, on the core chip CC0, no back-surface bumps BB and no back-surface alignment marks are provided. The layouts of the top-surface bumps FB and top-surface alignment marks are the same as those of the core chips CC1 to CC3. On the interface chip IF, as in the case of the core chips CC1 to CC3, the back-surface alignment marks are formed by penetrating electrodes TSV. The chip size of the interface chip IF is not necessarily equal to the chip size of the core chips CC0 to CC3. The interface chip IF may be smaller than the core chips CC0 to CC3. However, at least a plurality of back-surface bumps BB need to be formed in a region corresponding to the regions S0 of the core chips CC1 to CC3.

As described above, according to the present embodiment, both the back-surface alignment marks FCM3 and FCM4 are made up of a plurality of penetrating electrodes TSV; the shape and size of each of the penetrating electrodes TSV are the same as the shape and size of other penetrating electrodes TSV. Therefore, if original penetrating electrodes TSV, such as those for signals, power supply, and the like, are so designed as to be able to be most accurately formed, the penetrating electrodes TSV used for the alignment marks can be accurately formed, too, resulting in an improvement in the accuracy of the alignment marks and making it possible to efficiently stack the chips.

Each of the penetrating electrodes TSV that make up the back-surface alignment marks FCM3 and FCM4 has the same shape and size as other penetrating electrodes TSV. Therefore, the effects of distortion on the silicon substrates 80 can be kept at the same level as for the other penetrating electrodes TSV. That is, if the size of a penetrating electrode TSV is large, distortion of a silicon substrate 80 becomes large due to contraction of an oxide film that makes up the insulation ring 82, or a difference in expansion coefficient between the metal and silicon that make up the penetrating electrode TSV, or the like. Accordingly, if a back-surface alignment mark is made up of one large-size penetrating electrode TSV, the characteristics of a nearby transistor may change, possibly leading to malfunction. According the present embodiment, such a problem does not arise.

According to the present embodiment, the long sides of the core chips CC0 to CC3 run in the X-direction, and the short sides in the Y-direction. Therefore, it is desirable that injection of the underfill 94 be performed into the Y-direction from the side L11 or L12. In this case, if the support penetrating electrodes TSV are arranged along the sides L11 and L12, the support penetrating electrodes TSV become an obstacle for injection of the underfill 94. Therefore, the array pitch of the support penetrating electrodes TSV needs to be designed wide enough. However, according to the present embodiment, the support penetrating electrodes TSV are arranged along the sides L13 and L14, not along the sides L11 and L12. Therefore, the support penetrating electrodes TSV do not become an obstacle for injection of the underfill 94. Thus, the array pitch of the support penetrating electrodes TSV can be designed narrow enough (or at P0 according to the present embodiment) to ensure a high level of support ability.

The support penetrating electrodes TSV are arranged along the sides L13 and L14. Therefore, in the central regions that run along the sides L13 and L14, the peripheral circuits PE2 can be disposed. The peripheral circuits PE2 are disposed next to the peripheral circuit PE1. Therefore, some of circuit blocks that should originally be disposed in the peripheral circuit PE1 can be disposed in the peripheral circuit PE2. In this case, if the required size of the chip except the regions S0 to S4 where the penetrating electrodes TSV are provided is X0×Y0, what is obtained is as follows, as shown in FIG. 6 according to the present embodiment: (X0+2C)×Y0'+A. "A" represents the Y-direction width of the region S0. "C" represents the X-direction width of the regions S1 to S4 and the peripheral circuit PE2. "Y0'" is a value slightly smaller than the Y-direction width Y0 that is originally required. The reason is that, since a part of the peripheral circuit PE1 can be disposed in the peripheral circuit PE2, the Y-direction width of the peripheral circuit PE1 can be reduced. In this case, if the Y-direction width of the regions S1 to S4 is represented by D, the overhead associated with the regions S0 to S4 is 4CD+X0A. In this case, if X0=8 mm, Y0=6 mm, A=200 μm, C=100 μm, and D=500 μm, the ratio of the overhead area to X0×Y0 can be a small value, or 3.75%.

Figure 13:
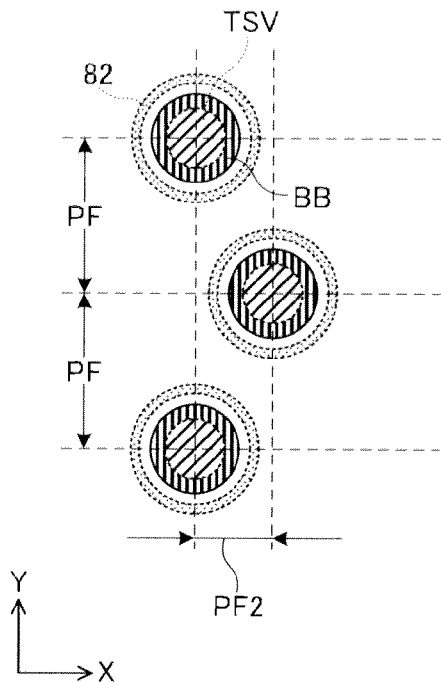
FIG. 13 is a top view showing a layout of a back-surface alignment mark according to a first modified example.

Turning to FIG. 13, the back-surface alignment mark according to the first modified example is made up of three penetrating electrodes TSV that are laid out at apexes of an isosceles triangle that is not right-angled. The X-direction distance between the two penetrating electrodes TSV arranged side by side in the Y-direction, and one remaining penetrating electrode TSV is so designed as to be PF2 (<PF). As a result, the amount of overhang toward the chip central portion becomes smaller, expanding a region where a transistor can be formed.

Figure 14:
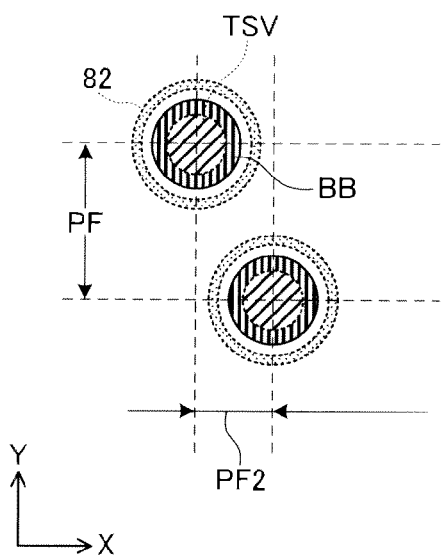
FIG. 14 is a top view showing a layout of a back-surface alignment mark according to a second modified example.

Turning to FIG. 14, the back-surface alignment mark according to the second modified example is made by removing, from the penetrating electrodes TSV shown in FIG. 13, one of the two penetrating electrodes TSV arranged side by side in the Y-direction. Even if such a back-surface alignment mark is used, the planar position of the back surface's side of the chip can be accurately recognized.

Figure 15:
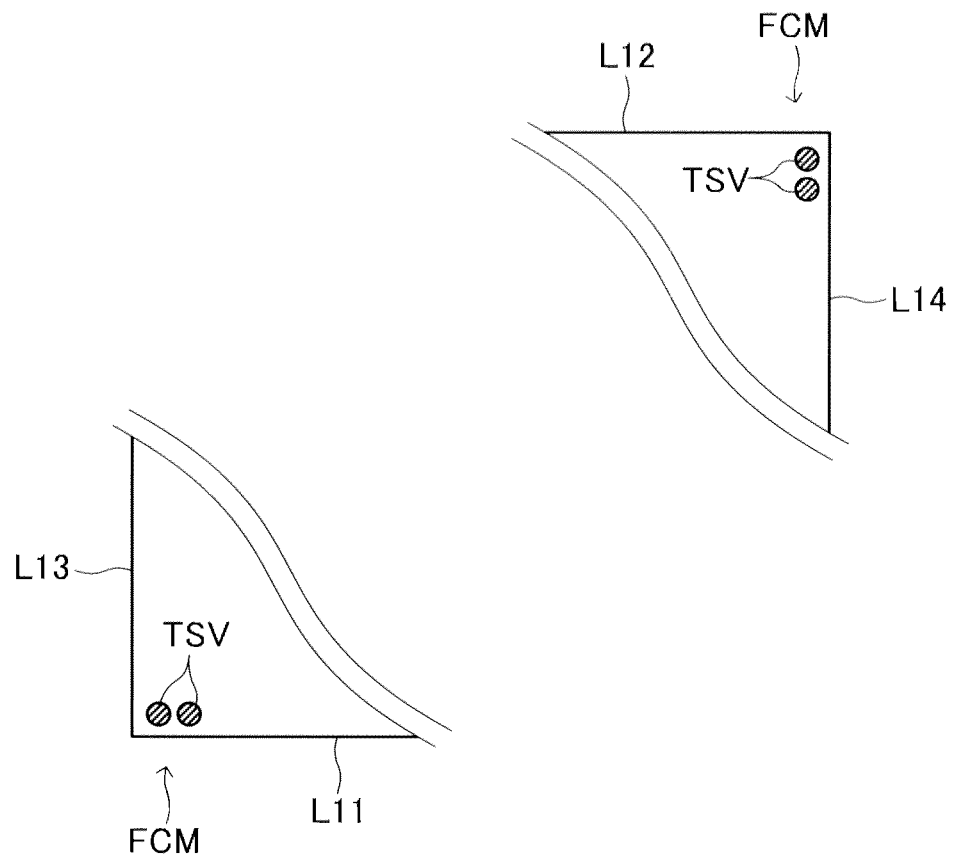
FIG. 15 is a top view showing a layout of a back-surface alignment mark according to a third modified example.

Turning to FIG. 15, one of the back-surface alignment marks is placed at one corner, and is made up of two penetrating electrodes TSV arranged side by side in the X-direction; the other back-surface alignment mark is placed at another corner, and is made up of two penetrating electrodes TSV arranged side by side in the Y-direction. The array pitch of all the penetrating electrodes TSV is PF. Even if such back-surface alignment marks are used, the planar position of the back surface's side of the chip can be accurately recognized.

It is apparent that the present invention is not limited to the above embodiments, but may be modified and changed without departing from the scope and spirit of the invention.

For example, there is described in each of the above embodiments is a semiconductor device of a type in which the interface chip IF and the core chips CC0 to CC3 are stacked. However, the present invention is not limited to the above type. Accordingly, the type and number of semiconductor chips stacked are not specifically limited. For example, the present invention can also be applied to a stacked semiconductor device in which a normal memory chip, which operates alone, and a memory chip are stacked; a semiconductor device in which a normal memory chip, which operates alone, and a controller chip (SoC), which has a function of controlling the memory chip, are stacked; and a stacked semiconductor device which includes semiconductor chips other than memory chips, such as a logic chip and a sensor chip. Furthermore, the technical concept of the present invention is realized not only in the situation where a plurality of semiconductor chips are stacked, but also in a single semiconductor chip that has not yet been stacked. The reason is that even a semiconductor chip that has not yet been stacked can achieve the above-described advantageous effects in the subsequent stacking process. Therefore, the scope of the present invention is not limited to the semiconductor device stacked.

Moreover, according to the present invention, the layout of a plurality of penetrating electrodes TSV that make up a back-surface alignment mark is not specifically limited. As long as the above layout is not mistaken for the layout of other penetrating electrodes TSV during image recognition by a recognition camera, any layout can be used. Therefore, the array pitch of the penetrating electrodes TSV that make up the back-surface alignment mark can be designed larger than the array pitch P0 of other penetrating electrodes TSV. While the array pitch is equal to the array pitch P0 of other penetrating electrodes TSV, any layout that is not available to the other penetrating electrodes TSV can be used.

What is claimed is:

1. A semiconductor device comprising:
   a semiconductor substrate including a first surface and a second surface opposite to each other; and
   a plurality of alignment marks, the plurality of alignment marks comprising a plurality of first through-substrate vias, each of the plurality of first through-substrate vias penetrating through the semiconductor substrate from the first surface to the second surface, each of the plurality of first through-substrate vias including a first bump that protrudes from the first surface of the semiconductor substrate.

2. The semiconductor device as claimed in claim 1, further comprising a plurality of second through-substrate vias each penetrating through the semiconductor substrate from the first surface to the second surface, wherein
   the second through-substrate vias transmit corresponding signals, and the first through-substrate vias are arranged narrower in pitch than the second through-substrate vias.

3. The semiconductor device as claimed in claim 2, further comprising:
a plurality of second bumps provided over the second surface of the semiconductor substrate,
wherein each of the second bumps is vertically aligned with an associated one of the second through-substrate vias.

4. The semiconductor device as claimed in claim 1, further comprising:
a first wiring layer provided over the second surface of the semiconductor substrate; and
a second surface alignment mark provided as the first wiring layer, the second-surface alignment mark being vertically aligned with the first surface alignment mark.

5. The semiconductor device as claimed in claim 2, further comprising a plurality of third through-substrate vias each penetrating through the semiconductor substrate from the first surface to the second surface, wherein
the second through-substrate vias are arranged in a first direction in a central portion of the semiconductor substrate, and
the third through-substrate vias are arranged in a second direction in an edge portion of the semiconductor substrate.

6. The semiconductor device as claimed in claim 5, wherein the third through-substrate vias are arranged substantially equal in pitch to the second through-substrate vias.

7. The semiconductor device as claimed in claim 1, further comprising:
a first wiring layer provided over the second surface of the semiconductor substrate; and
a first conductive pattern provided as the first wiring layer, wherein the first through-substrate vias are connected in common to the first conductive pattern.

8. The semiconductor device as claimed in claim 1, further comprising a plurality of fourth through-substrate vias each penetrating through the semiconductor substrate from the first surface to the second surface, each of the fourth through-substrate vias including a fourth bump that protrudes from the first surface of the semiconductor substrate, wherein
the fourth bumps serve as second surface alignment mark on the first surface of the semiconductor substrate,
the first surface alignment mark is arranged at a first corner portion on the first surface of the semiconductor substrate, and
the second surface alignment mark is arranged at a second corner portion on the first surface of the semiconductor substrate.

9. The semiconductor device as claimed in claim 8, wherein
the first and second corner portions are positioned at diagonally opposite corners, and
a layout of the first bumps is different from a layout of the fourth bumps.

10. The semiconductor device as claimed in claim 8, further comprising an auxiliary alignment mark arranged at a third corner portion on the first surface of the semiconductor substrate,
wherein the auxiliary alignment mark includes a fifth bump of a fifth through-substrate via penetrating through the semiconductor substrate from the first surface to the second surface.

11. A semiconductor device comprising:
a semiconductor substrate;
first and second conductive patterns provided over a surface of the semiconductor substrate;
a plurality of alignment marks, the plurality of alignment marks comprising at least one of a plurality of first through-substrate vias and a plurality of second through-substrate vias, each of the plurality of first through-substrate vias and each of the plurality of second through-substrate vias penetrating through the semiconductor substrate, the plurality of first through-substrate vias being arranged in a first pitch in a first corner portion of the semiconductor substrate and being coupled in common to the first conductive pattern,
the plurality of second through-substrate vias being arranged in the first pitch in a second corner portion of the semiconductor substrate and being coupled in common to the second conductive pattern; and
a plurality of third through-substrate vias each penetrating through the semiconductor substrate, the plurality of third through-substrate vias being arranged in a second pitch that is greater than the first pitch and supplied respectively with signals.

12. The semiconductor device as claimed in claim 11, wherein
the first and second corner portions are positioned at diagonally opposite corners, and
a layout of first through-substrate vias is different from a layout of the second through-substrate vias.

13. The semiconductor device as claimed in claim 12, further comprising third and fourth conductive patterns, wherein
the third conductive pattern is vertically overlap with the first through-substrate vias,
the fourth conductive pattern is vertically overlapped with the second through-substrate vias.

14. The semiconductor device as claimed in claim 13, wherein
the first and second conductive patterns and the third and fourth conductive patterns are formed on different wiring layers,
the third conductor pattern is vertically covered with the first conductor pattern, and
the fourth conductor pattern is vertically covered with the second conductor pattern.

* * * * *